(12) United States Patent
Mallick et al.

(10) Patent No.: US 10,580,642 B2
(45) Date of Patent: Mar. 3, 2020

(54) TWO-STEP PROCESS FOR SILICON GAPFILL

(71) Applicant: Applied Materials, Inc., Santa Clara, CA (US)

(72) Inventors: Abhijit Basu Mallick, Palo Alto, CA (US); Pramit Manna, Sunnyvale, CA (US); Shishi Jiang, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/945,117

(22) Filed: Apr. 4, 2018

(65) Prior Publication Data

US 2018/0286669 A1   Oct. 4, 2018

Related U.S. Application Data

(60) Provisional application No. 62/481,409, filed on Apr. 20, 2017.

(51) Int. Cl.
| | |
|---|---|
| *H01L 21/02* | (2006.01) |
| *H01L 21/285* | (2006.01) |
| *C23C 16/04* | (2006.01) |
| *C23C 16/513* | (2006.01) |
| *C23C 16/30* | (2006.01) |

(52) U.S. Cl.
CPC .... *H01L 21/02274* (2013.01); *H01L 21/0214* (2013.01); *H01L 21/0217* (2013.01); *H01L 21/0234* (2013.01); *H01L 21/02164* (2013.01); *H01L 21/02167* (2013.01); *H01L 21/02211* (2013.01); *H01L 21/02348* (2013.01); *H01L 21/28518* (2013.01); *C23C 16/30* (2013.01); *C23C 16/513* (2013.01)

(58) Field of Classification Search
CPC . H01L 21/02274; C23C 16/325; C23C 16/36; C23C 16/045; C23C 16/401; C23C 16/50; C23C 16/56
See application file for complete search history.

(56) References Cited

U.S. PATENT DOCUMENTS

| | | | |
|---|---|---|---|
| 7,629,227 B1 | 12/2009 | Wang et al. | |
| 2007/0281495 A1* | 12/2007 | Mallick | C23C 16/045 438/778 |
| 2009/0104790 A1* | 4/2009 | Liang | C23C 16/34 438/788 |
| 2012/0142192 A1 | 6/2012 | Li et al. | |
| 2012/0149213 A1* | 6/2012 | Nittala | C23C 16/02 438/783 |
| 2015/0099342 A1 | 4/2015 | Tsai et al. | |
| 2015/0179501 A1 | 6/2015 | Jhaveri et al. | |
| 2016/0020089 A1 | 1/2016 | Thadani | |

OTHER PUBLICATIONS

PCT International Search Report and Written Opinion in PCT/US2018/026023 dated Jul. 26, 2018, 13 pages.

\* cited by examiner

*Primary Examiner* — Sonya D. McCall-Shepard

(74) *Attorney, Agent, or Firm* — Servilla Whitney LLC

(57) ABSTRACT

Methods for seam-less gap fill comprising forming a flowable film by PECVD, treating the flowable film to form an Si—X film where X=C, O or N and curing the flowable film or Si—X film to solidify the film. The flowable film can be formed using a higher order silane and plasma. A UV cure, or other cure, can be used to solidify the flowable film or the Si—X film.

16 Claims, 2 Drawing Sheets

TWO-STEP PROCESS FOR SILICON GAPFILL

CROSS-REFERENCE TO RELATED APPLICATIONS

This application claims priority to U.S. Provisional Application No. 62/481,409, filed Apr. 4, 2017, the entire disclosure of which is hereby incorporated by reference herein.

TECHNICAL FIELD

The present disclosure relates generally to methods of depositing thin films. In particular, the disclosure relates to processes for filling narrow trenches with Si—X (X=N, O or C) materials.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable films become difficult. Resulting in films with varying composition throughout the filled trench.

Amorphous silicon has been widely used in semiconductor fabrication processes as a sacrificial layer since it can provide good etch selectivity with respect to other films (e.g., silicon oxide, amorphous carbon, etc.). With decreasing critical dimensions (CD) in semiconductor fabrication, filling high aspect ratio gaps becomes increasingly sensitive for advanced wafer fabrication. Current metal replacement gate processes involve a furnace poly-silicon or amorphous silicon dummy gate. A seam forms in the middle of the Si dummy gate due to the nature of process. This seam may be opened up during the post process and cause structure failure.

Conventional plasma-enhanced chemical vapor deposition (PECVD) of amorphous silicon (a-Si) forms a "mushroom shape" film on top of the narrow trenches. This is due to the inability of the plasma to penetrate into the deep trenches. The results in pinching-off the narrow trench from the top; forming a void at the bottom of the trench.

Therefore, there is a need for methods for gap filling high aspect ratio structures that can provide seam-free film growth.

SUMMARY

One or more embodiments of the disclosure are directed to a processing method comprising providing a substrate surface having at least one feature thereon. The at least one feature extends a depth from the substrate surface to a bottom surface. The at least one feature has a width defined by a first sidewall and a second sidewall. A flowable film is formed on the substrate surface and the first sidewall, second sidewall and bottom surface of the at least one feature. The flowable film fills the feature with substantially no seam formed. The flowable film is treated to form an Si—X film, where X is one or more of N, O or C. The Si—X film is cured to solidify the film and form a substantially seam-free gapfill.

Additional embodiments of the disclosure are directed to processing methods comprising providing a substrate surface having at least one feature thereon. The at least one feature extends a depth from the substrate surface to a bottom surface. The at least one feature has a width defined by a first sidewall and a second sidewall and an aspect ratio greater than or equal to about 25:1. A flowable silicon film is formed by PECVD on the substrate surface and the first sidewall, second sidewall and bottom surface of the at least one feature. The flowable film fills the feature with substantially no seam formed. The flowable film is treated with a post-treatment process to form an Si—X film, where X is one or more of N, O or C. The Si—X film is cured to solidify the film and form a substantially seam-free gapfill.

Further embodiments of the disclosure are directed to processing method comprising providing a substrate surface having at least one feature thereon, the at least one feature extending a depth from the substrate surface to a bottom surface. The at least one feature has a width defined by a first sidewall and a second sidewall and an aspect ratio greater than or equal to about 25:1. A flowable silicon film is formed by a PECVD process on the substrate surface and the first sidewall, second sidewall and bottom surface of the at least one feature. The flowable film fills the feature with substantially no seam formed. The PECVD process comprises a polysilicon precursor and a plasma comprising a plasma gas. The polysilicon precursor comprises one or more of disilane, trisilane, tetrasilane, neopentasilane or cyclohexasilane. The plasma gas comprises one or more of He, Ar, Kr, $H_2$, $N_2$, $O_2$, $O_3$ or $NH_3$. The plasma has a power less than or equal to about 200 W. The PECVD process occurs at a temperature less or equal to about 100° C. The flowable film is exposed to a post-treatment process comprising a post-treatment chemical and a post-treatment plasma to form an Si—X film, where X is one or more of N, O or C. The post-treatment chemical comprises one or more of $NH_3$, $N_2O$, $N_2$, $O_3$, $O_2$ or $C_xH_y$, where y=2x+2 or 2x. The post-treatment plasma comprises a conductively coupled plasma with a power in the range of about 100 W to about 1000 W or an inductively coupled plasma with a power in the range of about 2000 W to about 10000 W. The Si—X film is exposed to a UV cure to solidify the film and form a substantially seam-free gapfill.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
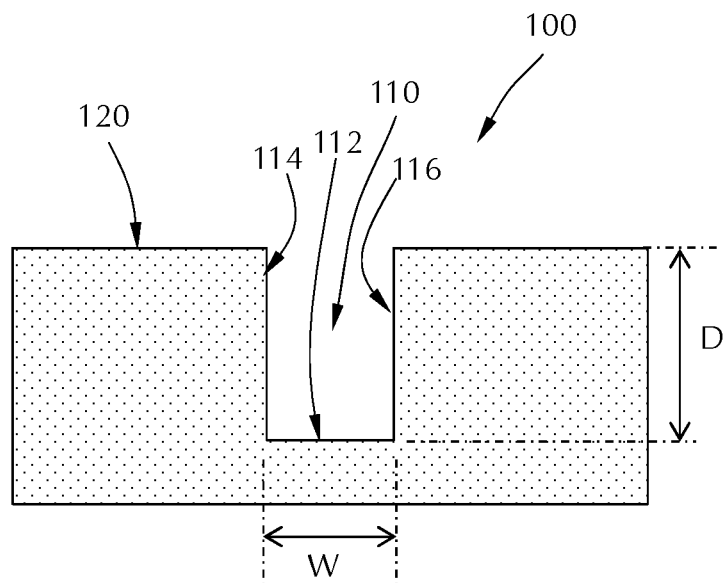
FIG. 1 shows a cross-sectional view of a substrate feature in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of depositing a film (e.g., amorphous silicon) in high aspect ratio (AR) structures with small dimensions. Some embodiments advantageously provide methods involving cyclic deposition-treatment processes that can be performed in a cluster tool environment. Some embodiments advantageously provide seam-free high quality amorphous silicon films to fill up high AR trenches with small dimensions.

One or more embodiments of the disclosure are directed to processes where flowable amorphous silicon films are deposited which are able to fill high aspect ratio structures (e.g., AR>8:1) having less than 20 nm critical dimensions (CD). The films can be deposited using a polysilane precursor with plasma enhanced chemical vapor deposition (PECVD) at low temperature (e.g., <100° C.). Plasma power for the process can be kept below about 100, 150, 200 W or 300 W to reduce the reaction kinetics and obtain haze free films. The chamber body temperature can also be controlled by controlling the heat exchanger temperature. Disilane, trisilane, tetrasilane, neopentasilane, cyclohexasilanes are typical polysilanes which can be used. Post-deposition treatment such as UV curing can be performed to stabilize the film. Embodiments of the process allow for the preparation of flowable SiC and SiCN films by addition of hydrocarbons and nitrogen sources to the flowable Si process. Additionally, flowable metal silicides (WSi, TaSi, NiSi) can also be deposited by adding an appropriate metal precursor to the flowable silicon process.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature).

In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or environment for further processing.

Figure 2:
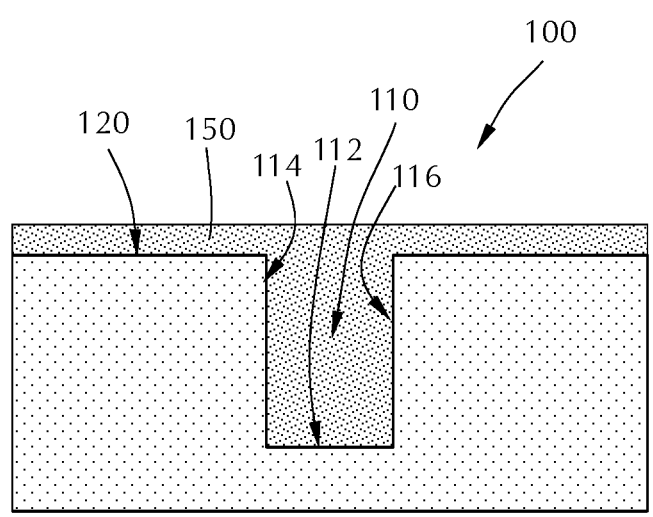
FIG. 2 shows a cross-sectional view of the substrate feature of FIG. 1 with a flowable film thereon.

As shown in FIG. 2, a flowable film 150 is formed on the substrate surface 120 and the first sidewall 114, second sidewall 116 and bottom surface 112 of the at least one feature 110. The flowable film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1%) of the cross-sectional area of the sidewall.

The flowable film 150 can be formed by any suitable process. In some embodiments, the forming the flowable film is done by plasma-enhanced chemical vapor deposition (PECVD). Stated differently, the flowable film can be deposited by a plasma-enhanced chemical vapor deposition process.

The PECVD process of some embodiments comprises exposing the substrate surface to a reactive gas. The reactive gas can include a mixture of one or more species. For example, the reactive gas may comprise a silicon precursor and a plasma gas. The plasma gas can be any suitable gas that can be ignited to form a plasma and/or can act as a carrier or diluent for the precursor.

In some embodiments, the silicon precursor comprises a higher order silane, also referred to as a polysilicon species, and is referred to as a polysilicon precursor. The polysilicon precursor of some embodiments comprises one or more of disilane, trisilane, tetrasilane, neopentasilane and/or cyclohexasilane. In one or more embodiments, the polysilicon precursor comprises tetrasilane. In some embodiments, the polysilicon precursor consists essentially of tetrasilane. As used in this regard, the term "consists essentially of" means that the silicon species of the reactive gas is made up of about 95% or more of the designated species on a molar basis. For example, a polysilicon precursor consisting essentially of tetrasilane means that the silicon species of the reactive gas is greater than or equal to about 95% tetrasilicon on a molar basis.

In some embodiments, the plasma gas comprises one or more of He, Ar, $H_2$, Kr, $N_2$, $O_2$, $O_3$ or $NH_3$. The plasma gas of some embodiments, is used as a diluent or carrier gas for the reactive species (e.g., the polysilicon species) in the reactive gas.

The plasma can be generated or ignited within the processing chamber (e.g., a direct plasma) or can be generated outside of the processing chamber and flowed into the processing chamber (e.g., a remote plasma). The plasma power can be maintained at a low enough power to prevent reduction of the polysilicon species to silanes and/or to minimize or prevent haze formation in the film. In some embodiments, the plasma power is less than or equal to about 300 W. In one or more embodiments, the plasma power is less than or equal to about 250 W, 200 W, 150 W, 100 W, 50 W or 25 W. In some embodiments, the plasma power is in the range of about 10 W to about 200 W, or in the range of about 25 W to about 175 W, or in the range of about 50 W to about 150 W.

The flowable film 150 can be formed at any suitable temperature. In some embodiments, the flowable film 150 is formed at a temperature in the range of about −100° C. to about 50° C., or in the range of about −75° C. to about 40° C., or in the range of about −50° C. to about 25° C., or in the range of about −25° C. to about 0° C. The temperature can be kept low to preserve the thermal budget of the device being formed. In some embodiments, forming the flowable film occurs at a temperature less than about 50° C., 40° C., 30° C., 20° C., 10° C., 0° C., −10° C., −20° C., −30° C., −40° C., −50° C., −60° C., −70° C., −80° C. or −90° C.

The flowable film 150 can be formed at any suitable pressure. In some embodiments, the pressure used for formation of the flowable film 150 is in the range of about 0.5 T to about 50 T, or in the range of about 0.75 T to about 25 T, or in the range of about 1 T to about 10 T.

The composition of the flowable film can be adjusted by changing the composition of the reactive gas. In some embodiments, the flowable film comprises one or more of SiN, SiO, SiC, SiOC, SiON, SiCON. To form an oxygen containing film, the reactive gas may comprise, for example, one or more of oxygen, ozone or water. To form a nitrogen containing film, the reactive gas may comprise, for example, one or more of ammonia, hydrazine, $NO_2$ or $N_2$. To form a carbon containing film, the reactive gas may comprise, for example, one or more of propylene and acetylene. Those skilled in the art will understand that combinations of or other species can be included in the reactive gas mixture to change the composition of the flowable film.

In some embodiments, the flowable film comprises a metal silicide. The reactive gas mixture may include, for example, a precursor comprising one or more of tungsten, tantalum or nickel. Other metal precursors can be included to change the composition of the flowable film.

Figure 3:
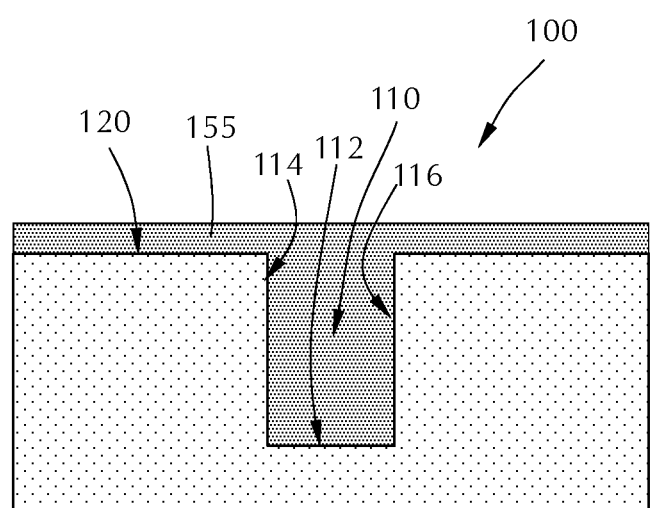
FIG. 3 shows a cross-sectional view of the substrate feature of FIG. 1 with a Si—X film thereon.

Referring to FIG. 3, after formation, the flowable film 150 of some embodiments is treated to form an Si—X film 155, where X is one or more of N, O or C. Treatment of the flowable film 150 may also be referred to as post-treatment. As used in this manner, the term "post-treatment" refers to a process that occurs after formation of the flowable film 150. When the composition of the flowable film 150 is adjusted using various reactants, treatment of the flowable film causes a change in the composition of the flowable film or the relative percentages of the atoms in the flowable film. For example, if the flowable film 150 is 80% Si, 20% N on an atomic basis, treatment may result in a film that is 50% Si, 50% N on an atomic basis.

The post-treatment process comprises exposing the substrate to a post-treatment chemical and a post-treatment plasma. The post-treatment chemical of some embodiments comprises one or more of $NH_3$, $N_2O$, $N_2$, $O_3$, $O_2$ or $C_xH_y$, where y=2x+2 or 2x. In some embodiments, the post-treatment chemical comprises $C_xH_y$, where $C_xH_y$ comprises one or more of a C1-C12 alkyl, alkenyl or cycloalkyl species. In some embodiments, the post-treatment chemical comprises the same species as the reactant used in formation of the flowable film. In some embodiments, the post-treatment chemical comprises different species than the reactant used in formation of the flowable film.

The post-treatment plasma can be generated using the post-treatment chemical or a post-treatment plasma species different from the post-treatment chemical. For example, the post-treatment chemical might be flowed with a diluent or carrier gas which is used to ignite the plasma (e.g., argon). The post-treatment chemical can be continuously flowed or pulsed into the processing chamber.

The post-treatment plasma of some embodiments is a conductively coupled plasma with a power in the range of about 100 W to about 1000 W, or in the range of about 200 W to about 900 W, or in the range of about 300 W to about 800 W, or in the range of about 400 W to about 700 W. In some embodiments, the post-treatment plasma has a power that is greater than the power used to form the flowable film 150. For example, in some embodiments, the flowable film is formed with a 100 W plasma and the post-treatment occurs with a 500 W plasma.

The post-treatment plasma of some embodiments is an inductively coupled plasma with a power in the range of about 2000 W to about 10000 W, or in the range of about 3000 W to about 9000 W, or in the range of about 4000 W to about 8000 W, or in the range of about 5000 W to about 7000 W.

After formation of the flowable film 150 or the Si—X film 155, the film is cured to solidify the flowable film 150 or the Si—X film 155 and form a substantially seam-free gapfill. In some embodiments, the flowable film 150 or the Si—X film 155 is cured by exposing the film to a UV curing process. The UV curing process can occur at a temperature in the range of about 10° C. to about 550° C. The UV curing process can occur for any suitable time frame necessary to sufficiently solidify the flowable film 150 or the Si—X film 155. In some embodiments, the UV cure occurs for less than or equal to about 10 minutes, 9 minutes, 8 minutes, 7 minutes, 6 minutes, 5 minutes, 4 minutes, 3 minutes, 2 minutes or 1 minute.

In some embodiments, curing the flowable film 150 or the Si—X film 155 comprises exposure to a plasma or an electron beam. A plasma exposure to cure the film comprises a plasma separate from the PECVD plasma or the post-treatment plasma. The plasma species and processing chamber can be the same or different and the plasma cure may be a different step than the PECVD process or the post-treatment plasma. In some embodiments, the post-treatment plasma treats and cures the flowable film 150 at the same time to form a cured Si—X film 155.

Some embodiments of the disclosure provide cured gap fill films with low hydrogen content. In some embodiments, after curing the film, the gap fill film has a hydrogen content less than or equal to about 10 atomic percent. In some embodiments, the cured film has a hydrogen content less than or equal to about 5 atomic percent. In some embodiments, the cured film has a hydrogen content less than or equal to about 8, 6, 4 or 2 atomic percent.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
    forming a flowable film on a substrate surface having at least one feature thereon, and a first sidewall, a second sidewall and a bottom surface of the at least one feature, the feature having a width defined by the first sidewall and the second sidewall, the flowable film filling the feature with substantially no seam formed, the flowable film comprising a metal silicide formed by plasma-enhanced chemical vapor deposition (PECVD) comprising one or more of tetrasilane or neopentasilane, a precursor comprising one or more of tungsten, tantalum or nickel, and a plasma comprising a plasma gas; and
    treating the flowable film by exposing the substrate to a post-treatment chemical and a post-treatment plasma comprising a post-treatment plasma species different from the post-treatment chemical to form an Si—X containing metal silicide film, where X is one or more of N, O or C; and
    curing the Si—X containing metal silicide film to solidify the film and form a substantially seam-free gapfill.

2. The processing method of claim 1, wherein the plasma gas comprises one or more of He, Ar, Kr, $H_2$, $N_2$, $O_2$, $O_3$ or $NH_3$.

3. The processing method of claim 2, wherein the plasma has a power less than about 300 W.

4. The processing method of claim 2, wherein the plasma is a direct plasma.

5. The processing method of claim 1, wherein forming the flowable film occurs at a temperature less than about 100° C.

6. The processing method of claim 1, wherein curing the flowable film comprises a UV cure.

7. The processing method of claim 6, wherein the UV cure occurs at a temperature in the range of about 10° C. to about 550° C.

8. The processing method of claim 1, wherein curing the flowable film comprises exposing the flowable film to a plasma separate from the PECVD plasma and/or an electron beam.

9. The processing method of claim 1, wherein the flowable film comprises one or more of SiN, SiO, SiC, SiOC, SiON, SiCON.

10. The processing method of claim 9, wherein the PECVD further comprises one or more of propylene, acetylene, ammonia, oxygen, ozone or water.

11. The processing method of claim 1, wherein the post-treatment chemical comprises one or more of $NH_3$, $N_2O$, $N_2$, $O_3$, $O_2$ or $C_xH_y$, where y=2x+2 or 2x.

12. The processing method of claim 1, wherein the post-treatment plasma is a conductively coupled plasma with a power in the range of about 100 W to about 1000 W.

13. The processing method of claim 1, wherein the post-treatment plasma is an inductively coupled plasma with a power in the range of about 2000 W to about 10000 W.

14. A processing method comprising:
providing a substrate surface having at least one feature thereon, the at least one feature extending a depth from the substrate surface to a bottom surface, the at least one feature having a width defined by a first sidewall and a second sidewall and an aspect ratio greater than or equal to about 25:1;
forming a flowable metal silicide film by PECVD on the substrate surface and the first sidewall, second sidewall and bottom surface of the at least one feature, the flowable metal silicide film filling the feature with substantially no seam formed;
treating the flowable film with a post-treatment process to form a metal silicide film comprising Si—X, where X is one or more of N, O or C; and
curing the metal silicide film comprising Si—X to solidify the film and form a substantially seam-free gapfill.

15. The processing method of claim 14, wherein the PECVD comprises a polysilicon precursor and a plasma comprising a plasma gas, the polysilicon precursor comprising one or more of disilane, trisilane, tetrasilane, neopentasilane or cyclohexasilane, the plasma gas comprises one or more of He, Ar, Kr, $H_2$, $N_2$, $O_2$, $O_3$ or $NH_3$, and the post-treatment process comprises a post-treatment chemical comprising one or more of $NH_3$, $N_2O$, $N_2$, $O_3$, $O_2$ or $C_xH_y$, where y=2x+2 or 2x, and a post-treatment plasma.

16. A processing method comprising:
providing a substrate surface having at least one feature thereon, the at least one feature extending a depth from the substrate surface to a bottom surface, the at least one feature having a width defined by a first sidewall and a second sidewall and an aspect ratio greater than or equal to about 25:1;
forming a flowable silicon film by a PECVD process on the substrate surface and the first sidewall, second sidewall and bottom surface of the at least one feature, the flowable film filling the feature with substantially no seam formed, the PECVD process comprises a polysilicon precursor and a plasma comprising a plasma gas, the polysilicon precursor comprising one or more of tetrasilane or neopentasilane, the plasma gas comprises one or more of He, Ar, Kr, $H_2$, $N_2$, $O_2$, $O_3$ or $NH_3$, the plasma has a power less than or equal to about 200 W, and the PECVD process occurs at a temperature less or equal to about 100° C.;
exposing the flowable film to a post-treatment process comprising a post-treatment chemical and a post-treatment plasma comprising a post-treatment plasma species to form an Si—X film, where X is one or more of N, O or C, the post-treatment chemical comprising one or more of $NH_3$, $N_2O$, $N_2$, $O_3$, $O_2$ or $C_xH_y$, where y=2x+2 or 2x, the post-treatment plasma species different from the post treatment chemical, the post-treatment plasma comprising a conductively coupled plasma with a power in the range of about 100 W to about 1000 W or an inductively coupled plasma with a power in the range of about 2000 W to about 10000 W; and
exposing the Si—X film to a UV cure to solidify the film and form a substantially seam-free gapfill.

* * * * *